(12) United States Patent
Shelnut et al.

(10) Patent No.: US 7,615,130 B2
(45) Date of Patent: Nov. 10, 2009

(54) METHODS OF FORMING PRINTED CIRCUIT BOARDS

(75) Inventors: James G. Shelnut, Lancaster, MA (US); Matthew L. Moynihan, Sterling, MA (US); Nicola Pugliano, Grafton, MA (US); Philip D. Knudsen, Northboro, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 547 days.

(21) Appl. No.: 11/207,627

(22) Filed: Aug. 19, 2005

(65) Prior Publication Data
US 2006/0098926 A1 May 11, 2006

Related U.S. Application Data

(60) Provisional application No. 60/602,980, filed on Aug. 19, 2004.

(51) Int. Cl.
B32B 15/00 (2006.01)
(52) U.S. Cl. ............... 156/247; 156/249; 385/126
(58) Field of Classification Search ............... 156/247, 156/249; 385/126
See application file for complete search history.

(56) References Cited

U.S. PATENT DOCUMENTS

| | | | |
|---|---|---|---|
| 5,292,620 A | | 3/1994 | Booth et al. |
| 5,402,514 A | | 3/1995 | Booth et al. |
| 5,540,799 A | | 7/1996 | Lebby et al. |
| 5,598,501 A | * | 1/1997 | Maruo et al. ............... 385/143 |
| 5,858,051 A | | 1/1999 | Komiyama et al. |
| 6,144,795 A | * | 11/2000 | Dawes et al. ............... 385/141 |
| 6,440,642 B1 | | 8/2002 | Shelnut et al. |
| 6,511,615 B1 | | 1/2003 | Dawes et al. |
| 6,555,288 B1 | * | 4/2003 | Xu et al. ............... 430/270.1 |
| 6,731,857 B2 | | 5/2004 | Shelnut et al. |
| 7,025,849 B2 | * | 4/2006 | Kim et al. ............... 156/257 |
| 2002/1003605 | * | 3/2002 | Yoshimura et al. ............... 156/234 |

(Continued)

FOREIGN PATENT DOCUMENTS

EP  1 426 793  6/2004

(Continued)

OTHER PUBLICATIONS

Bhattacharya et al., "Integral passives for next generation of electronic packaging: application of epoxy/ceramic nanocomposites as integral capacitors", Microelectronics Journal, vol. 32, No. 1, Jan. 2001, pp. 11-19.

(Continued)

Primary Examiner—Philip C Tucker
Assistant Examiner—Kimberly K McClelland
(74) Attorney, Agent, or Firm—Jonathan D. Baskin

(57) ABSTRACT

Provided are methods of forming a printed circuit board having optical functionality. The methods involve: (a) providing a first, printed circuit board substrate; (b) forming an optical waveguide structure comprising a clad and a core structure on a second substrate separate from the printed circuit board substrate, wherein the optical waveguide structure comprises a silicon-containing material; (c) separating the optical waveguide structure from the second substrate; and (d) affixing the optical waveguide structure to the printed circuit board substrate. The invention has particular applicability in the electronics and optoelectronics industries for the formation of hybrid printed circuit boards.

13 Claims, 5 Drawing Sheets

U.S. PATENT DOCUMENTS

| | | |
|---|---|---|
| 2002/0135991 A1 | 9/2002 | Doi |
| 2003/0091926 A1 | 5/2003 | Shelnut |
| 2003/0099899 A1 | 5/2003 | Gronbeck et al. |
| 2003/0178118 A1* | 9/2003 | Ishihara ............ 156/1 |
| 2003/0209515 A1 | 11/2003 | Pavelchek |
| 2004/0022499 A1 | 2/2004 | Shimizu et al. |
| 2004/0047580 A1 | 3/2004 | Shimada et al. |
| 2004/0063026 A1 | 4/2004 | Barr et al. |
| 2004/0109950 A1* | 6/2004 | Adams et al. ............ 427/387 |
| 2004/0253535 A1 | 12/2004 | Cameron et al. |
| 2004/0265754 A1 | 12/2004 | Barclay et al. |
| 2005/0002631 A1* | 1/2005 | Yamaguchi et al. ......... 385/130 |
| 2006/0133755 A1 | 6/2006 | Shelnut et al. |
| 2006/0133756 A1 | 6/2006 | Shelnut et al. |
| 2006/0133766 A1 | 6/2006 | Shelnut et al. |

FOREIGN PATENT DOCUMENTS

| | | |
|---|---|---|
| EP | 1 251 155 | 1/2006 |
| JP | 1994-258537 | 9/1994 |
| JP | 2003-195080 | 7/2003 |
| JP | 2003-195081 | 7/2003 |
| JP | 2003-202437 | 7/2003 |
| WO | WO 03/005616 | 1/2003 |
| WO | WO 2004/037866 | 5/2004 |

OTHER PUBLICATIONS

Booth et al., "Low Loss Channel Waveguides in Polymers", Journal of Lightwave Technology, IEEE Service Center, New York, vol. 7, No. 10, Oct. 1989, pp. 1445-1453.

Booth et al., "Polyguide Polymeric Technology for Optical Interconnect Circuits and Components", vvww.opticalcrosslinks.com/pdf/photonics97.pdf, Photonics West, Conf. Proceedings, San Jose, CA, Feb. 12-14, 1997, vol. 3005, pp. 238-251.

J.T. Gallo et al., "High-Density Interconnects for 2-Dimensional VCSEL Arrays Suitable for Mass Scale Production", www.opticalcrosslinks.com/pdf/HighDensityInterconnects8.pdf, ITCom 2001, Paper 4532-47, 2001.

B. Booth, "Polymers for Integrated Optical Waveguides", *Polymers for Electronic and Photonic Applications*, C.P. Wang Ed., pp. 549-599, 1993, Academic Press.

Weber et al., "Light-Guiding Structures of Photoresist Films", Appl. Phys. Lett., vol. 20, No. 3, Feb. 1972, pp. 143-145.

Optical Crosslinks, "Polymer Technology Overview", www.opticalcrosslinks.com/pdf/WebPolymerTechnologyPlatform.pdf, 2001.

* cited by examiner

METHODS OF FORMING PRINTED CIRCUIT BOARDS

CROSS-REFERENCE TO RELATED APPLICATIONS

This application claims the benefit of priority under 35 U.S.C. §119(e) to U.S. Provisional Application No. 60/602,980, filed Aug. 19, 2004, the entire contents of which are incorporated herein by reference.

BACKGROUND OF THE INVENTION

The present invention relates generally to printed circuit boards (PCBs). In particular, the present invention relates to methods of forming printed circuit boards which have optical functionality, by incorporation into the circuit boards optical waveguides formed on a substrate separate from the printed circuit board.

Optical waveguides include a core and a clad surrounding the core, with optical radiation propagating in the core due to its higher index of refraction as compared to the clad. Embedded optical waveguides may be formed on a printed circuit board substrate by coating a first clad layer on the substrate, coating a core layer on the first clad layer, patterning the core layer into one or more core structures, and forming a second clad layer over the first core layer and core structures. The waveguide core layer is typically patterned using standard photolithography and etching processes with a photoresist, or by exposing and developing a photoimageable core layer. For example, U.S. Pat. No. 6,731,857 and U.S. Published Application No. US20040105652, to Shelnut et al, disclose embedded optical waveguides formed with silsesquioxane chemistry on a printed circuit board substrate.

Formation of the optical layers at the same site as the other circuit board processes may have deleterious effects on the resulting optical structures. For example, many of the standard circuit board manufacturing processes, such as plating and drilling processes, generate particulates and other forms of contamination. This contamination may become incorporated into the waveguide layers during formation of the waveguide structures, adversely affecting light transmission properties of the waveguides, for example, by increasing optical loss through light scattering and/or absorption. This is particularly problematic for the waveguide core layer. Such contamination may also give rise to defects during core patterning, as the waveguide structures generally require higher resolution patterning techniques than are typical for standard PCB manufacture. It would therefore be desirable to have methods that allow for the manufacture of waveguides in an environment protected from contamination generated by other circuit board manufacturing processes.

There is thus a need in the optoelectronics industry for improved methods of forming printed circuit boards having optical functionality which overcome or conspicuously ameliorate one or more of the problems described above.

SUMMARY OF THE INVENTION

Provided are methods of forming printed circuit boards having optical functionality. The methods involve: (a) providing a first, printed circuit board substrate; (b) forming an optical waveguide structure which includes a clad and a core structure on a second substrate separate from the printed circuit board substrate, wherein the optical waveguide structure includes a silicon-containing material; (c) separating the optical waveguide structure from the second substrate; and (d) affixing the optical waveguide structure to the printed circuit board substrate. The invention has particular applicability in the electronics and optoelectronics industries for forming hybrid printed circuit boards, i.e., printed circuit boards having electrical and optical functionality.

Advantageously, the embedded waveguide structures in accordance with the invention may be formed in an environment protected from contamination generated by other, particulate-generating circuit board manufacturing processes, allowing for waveguides having improved optical properties.

Other objects and advantages of the present invention will become apparent to one skilled in the art upon review of the following description, claims, and drawings appended hereto.

BRIEF DESCRIPTION OF THE DRAWINGS

The present invention will be discussed with reference to the following drawings, in which like reference numerals denote like features, and in which.

DETAILED DESCRIPTION OF THE INVENTION

The invention provides methods of forming printed circuit boards having optical functionality. Briefly stated, the methods involve forming an optical waveguide structure on a first substrate. The clad and/or the core of the optical waveguide structure is formed from a silicon-containing material. The optical waveguide structure is separated from the first substrate and is affixed to a printed circuit board substrate.

Unless otherwise specified, amounts for components of the described compositions are given in weight percentage based on the composition absent any solvent. As used herein, the term "polymer" includes oligomers, dimers, trimers, tetramers and the like, and encompasses homopolymers and higher order polymers, i.e., polymers formed from two or more different monomer units and heteropolymers. The term "alkyl" refers to linear, branched and cycloalkyl groups, which are substituted or unsubstituted and may include heteroatoms in or on the chain. The term "aromatic" refers to aromatic groups, which are substituted or unsubstituted and may include heterocycles. The terms "halogen" and "halo" include fluorine, chlorine, bromine, and iodine. Thus the term "halogenated" refers to fluorinated, chlorinated, brominated, and iodinated. The terms "a" and "an" mean "one or more". The term "on" and "over" are used interchangeably in defining spatial relationships, and encompass the presence or absence of intervening layers or structures.

Figure 1:
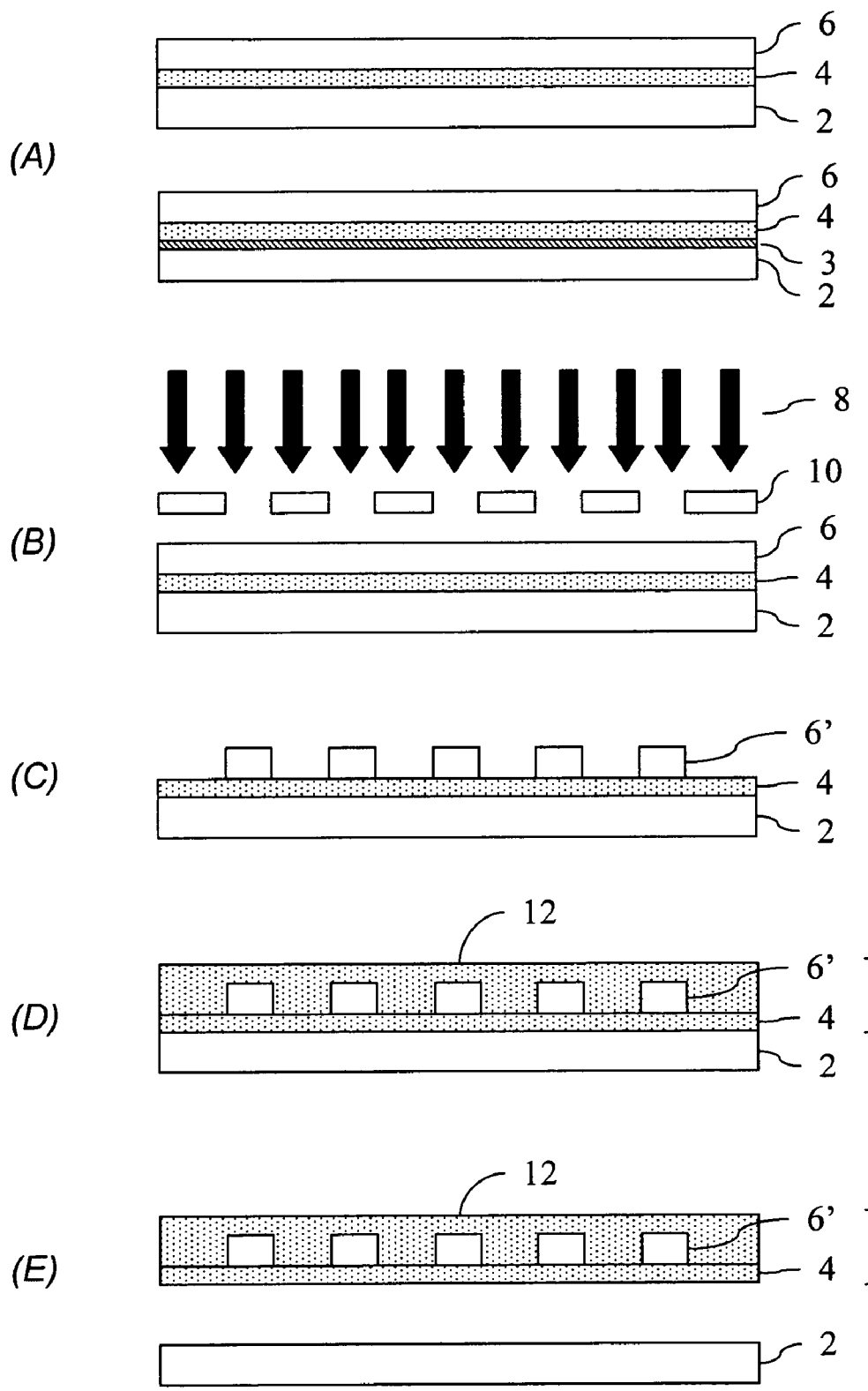
FIG. 1A-E illustrates optical waveguides at various stages of formation thereof, in accordance with the invention.
Figure 2:
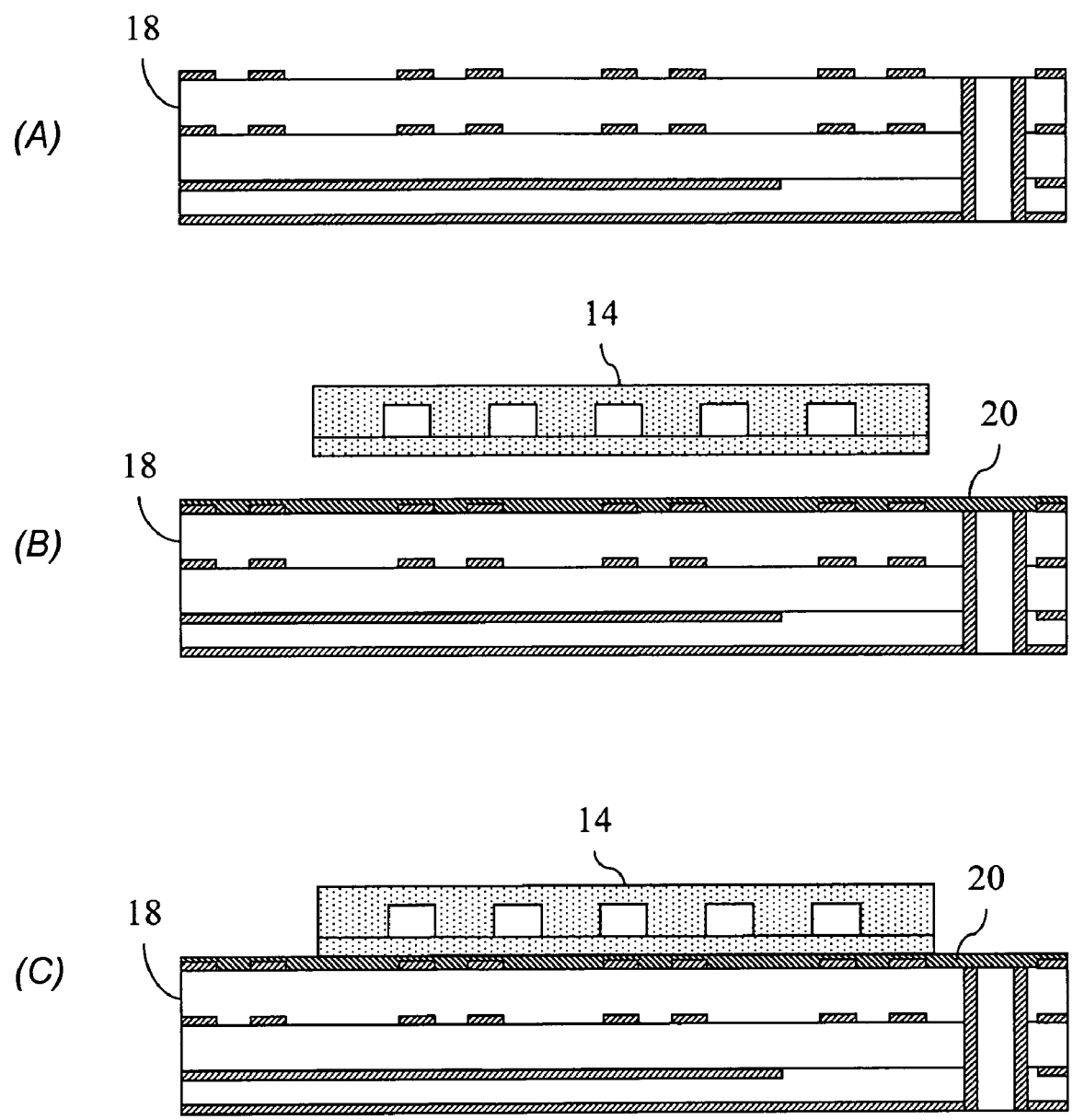
FIG. 2A-C illustrates a printed circuit board incorporating the optical waveguides of FIG. 1 at various stages of formation thereof, in accordance with the invention.

The invention will be described with reference to exemplary embodiments thereof. FIGS. 1-2 illustrate a process flow for forming a printed circuit board having optical functionality in accordance with a first exemplary aspect of the invention.

As illustrated in FIG. 1A, a substrate 2 is provided on which an optical waveguide is to be formed. The substrate material is chosen such that the waveguide structure to be formed may be separated from the substrate without damage to the waveguide structure. Typical substrate materials include, for example, glass, stainless steel, metal foils such as copper foils, high impact polystyrene, and the like. Optionally, a release layer 3 which allows for easy separation of the waveguide structure from the substrate may be formed on the substrate. Suitable materials for the optional release layer include, for example, thermally or photochemically cured silicones, polyvinyl stearate, polyvinyl carbamates, poly N-ethyl-perfluoroactyl sulfanamidoethyl methacrylate, and other release materials such as those described in the *Handbook of Pressure Sensitive Adhesive Technology*, 2$^{nd}$ ed., Van Nostrand/Reinhold (1989). Optionally, the substrate may be a sacrificial material that is dissolved to release the waveguide structure, for example, a copper foil substrate in an acid etchant.

A waveguide structure is next formed on the substrate 2. The waveguides may, for example, be formed by a multilayer process including first clad layer formation, core layer formation followed by core patterning, and second clad layer formation. Another exemplary technique uses multiphoton absorption to expose an internal volume of a waveguide layer to bring about a refractive index change in the exposed volume to form the waveguide without the need for mechanically patterning a core layer.

The waveguide clad and/or core are formed of a silicon-containing material. Suitable silicon-containing materials include, for example, silsesquioxanes, caged silsesquioxanes, siloxanes, glasses such as SOG or doped glasses (e.g., BPSG, PSG, BSG), and combinations thereof. The waveguide may, for example, be formed from a composition that includes a hybrid organic-inorganic polymer having units of the formula ($RSiO_{1.5}$), wherein R is a substituted or unsubstituted organic group. The polymer may have a plurality of functional end groups. The polymer may be present in the composition in an amount of from 1 to 99.5 wt %, for example from 60 to 98.5 wt %. Exemplary organic groups for R include substituted and unsubstituted alkyl, aryl and heterocyclic groups. The alkyl groups may be straight chain, branched or cyclic having, for example, from 1 to 20 carbon atoms, and typically have from 1 to 20 carbon atoms, such as methyl, ethyl, propyl, isopropyl, t-butyl, t-amyl, octyl, decyl, dodecyl, cetyl, stearyl, cyclohexyl, and 2-ethylhexyl. The alkyl groups may be substituted with heteroatoms in and/or on the alkyl chain, for example, or may be non-aromatic cyclic groups such as cyclopentyl, cyclohexyl, norbonyl, adamantly, piperidinyl, tetrahydrofuranyl and tetrahydrothiophenyl groups. Exemplary aryl groups include those having from 6 to 20 carbon atoms, for example, from 6 to 15 carbon atoms, such as phenyl, tolyl, benzyl, 1-naphthyl, 2-naphthyl and 2-phenanthryl, and may be substituted with heteroatoms, for example hydroxy and/or amino. Heterocyclic groups may be aromatic, for example, thiophene, pyridine, pyrimidine, pyrrole, phosphole, arsole, and furane. Typical for R is a substituted and unsubstituted methyl, ethyl, propyl, cyclopentyl, cyclohexyl, benzyl, phenyl, adamantyl groups, and combinations thereof.

The polymer may take the form of a copolymer or higher order polymer, either random- or block-type. The polymer may include, for example, one or more additional silicon-containing units, with the proportions for each unit ranging from 1 to 85 wt %, for example, from 15 to 80 wt % or from 25 to 60 wt %, or from 25 to 50 wt %, based on the polymer. The additional units may, for example, be represented as silsesquioxanes, cage siloxanes, siloxanes and combinations thereof. For example, the polymer may further include units of the formula ($R^1SiO_{1.5}$), wherein $R^1$ is a substituted or unsubstituted organic group as described above with respect to R. One of R and $R^1$ may, for example, be chosen from substituted or unsubstituted alkyl groups, and the other of R and $R^1$ chosen from substituted or unsubstituted aryl groups. The polymer may be, for example, an alkyl silicon polymer such as a copolymer containing methyl silsesquioxane units and butyl silsesquioxane units; an aryl silicon polymer such as a copolymer containing phenyl silsesquioxane units and trifluoromethylphenyl-silsesquioxane units or an aralkyl silicon copolymer such as a copolymer containing methyl and phenyl silsesquioxane units.

Suitable siloxane units include, for example, units of the formula (($R^2)_2SiO$), wherein $R^2$ is a substituted or unsubstituted organic group, such as an alkyl group, for example, methyl, ethyl, propyl, and the like, or an aryl group, for example, phenyl, tolyl, and the like.

As described above, the side chain groups of the polymer may be optionally substituted. "Substituted" means that one or more hydrogen atoms on one or more side chain groups are replaced by another substituent group, for example, deuterium, halogen such as fluorine, bromine, and chlorine, ($C_1$-$C_6$)alkyl, ($C_1$-$C_6$)haloalkyl, ($C_1$-$C_{10}$)alkoxy, ($C_1$-$C_{10}$)alkylcarbonyl, ($C_1$-$C_{10}$)alkoxycarbonyl, ($C_1$-$C_{10}$)alkylcarbonyloxy, alkylamine, alkylsulfur containing materials, and the like. The polymers may contain a wide range of repeating units, either random or block. The polymer units useful in the present invention may have, for example, from 5 to 150 repeating units, typically from about 10 to 35 repeating units; and the siloxane units useful in the present invention may have for example from 5 to 150 repeating units, typically from about 7 to 25 repeating units. Thus, the polymer may vary widely in molecular weight. Typically, the polymers have a weight average molecular weight ($M_w$) of from about 500 to 15,000, more typically from about 1000 to 10,000, even more typically from about 1000 to 5000.

The polymers may include two or more functional end groups that allow a solubility change in the composition after photoactivation. Such end groups may be, for example, hydroxy; alkoxy such as ethoxy, propoxy, isopropoxy; carboxyester, amino, amido, epoxy, imino, carboxyacid, anhydride, olefinic, acrylic, acetal, orthoester, vinyl ether, and combinations thereof. The functional end content may be, for example, from about 0.5 to 35 wt % based on the polymer, for example from about 1 to 10 wt %, or from about 2 to 5 wt %.

The composition may further include a photoactive component. The photoactive component typically generates an acid or base upon activation and alters the solubility of the composition in a dried state in a developer. A wide variety of photoactive components may be used in the present invention, including, but not limited to, photoacid generators and photobase generators.

The photoacid generators useful in the present invention may be any compound or compounds which generate acid upon exposure to light. Suitable photoacid generators are known and include, but are not limited to, halogenated triazines, onium salts, sulfonated esters, substituted hydroxyimides, substituted hydroxylimines, azides, naphthoquinones such as diazonaphthoquinones, diazo compounds, and combinations thereof.

Particularly useful halogenated triazines include, for example, halogenated alkyl triazines such as the trihalomethyl-s-triazines. The s-triazine compounds are condensation reaction products of certain methyl-trihalomethyl-s-triazines and certain aldehydes or aldehyde derivatives. Such s-triazine compounds may be prepared according to the procedures disclosed in U.S. Pat. No. 3,954,475 and Wakabayashi et al., *Bulletin of the Chemical Society of Japan*, 42, 2924-30 (1969). Other triazine type photoacid generators useful in the present invention are disclosed, for example, in U.S. Pat. No. 5,366,846.

Onium salts with weakly nucleophilic anions are particularly suitable for use as photoacid generators in the present invention. Examples of such anions are the halogen complex anions of divalent to heptavalent metals or non-metals, for example, antimony, tin, iron, bismuth, aluminum, gallium, indium, titanium, zirconium, scandium, chromium, hafnium, copper, boron, phosphorus and arsenic. Examples of suitable onium salts include, but are not limited to, diazonium salts such as diaryl-diazonium salts and onium salts of group VA and B, IIA and B and I of the Periodic Table, for example, halonium salts such as iodonium salts, quaternary ammonium, phosphonium and arsonium salts, sulfonium salts such as aromatic sulfonium salts, sulfoxonium salts or selenium salts. Examples of suitable onium salts are disclosed, for example, in U.S. Pat. Nos. 4,442,197; 4,603,101; and 4,624,912. Sulfonium salts such as triphenylsulfonium hexafluorophosphate and mixtures thereof are typical.

The sulfonated esters useful as photoacid generators in the present invention include, for example, sulfonyloxy ketones. Suitable sulfonated esters include, but are not limited to, benzoin tosylate, t-butylphenyl alpha-(p-toluenesulfonyloxy)-acetate, 2,6-dinitrobenzyl tosylate, and t-butyl alpha-(p-toluenesulfonyloxy)-acetate. Such sulfonated esters are disclosed, for example, in the *Journal of Photopolymer Science and Technology*, vol. 4, No. 3, 337-340 (1991).

Substituted hydroxyimides which may be used include, for example, n-trifluoromethylsulfonyloxy-2,3-diphenylmaleimide and 2-trifluoromethylbenzenesulfonyloxy-2,3-diphenylmaleimide. Suitable substituted hydroxylimines include, for example, 2-(-nitrilo-2-methylbenzylidene)-(5-hydroxyiminobutylsulfonyl)-thiophene. Azides useful in the present invention include, for example, 2,6-(4-azidobenzylidene)cyclohexanone. Naphthoquinones may include, for example, 2,1-diazonaphthoquinone-4-sulfonate ester of 2,3,4-trihydroxybenzophenone. Among the diazo compounds, 1,7-bis(4-chlorosulonyl phenyl)-4-diazo-3,5-heptanedione may be used.

Photobase generators useful in the present invention may be any compound or compounds which liberate base upon exposure to light. Suitable photobase generators include, but are not limited to, benzyl carbamates, benzoin carbamates, O-carbamoylhydroxyamines, O-carbamoyloximes, aromatic sulfonamides, alpha-lactams, N-(2-allylethenyl)amides, arylazide compounds, N-arylformamides, 4-(ortho-nitrophenyl) dihydropyridines, and combinations thereof.

The amount of the photoactive component for altering the solubility useful in the present invention, in the case of a negative working material, is any amount sufficient to alter the solubility of the composition upon exposure to actinic radiation and render the exposed portion insoluble in a developer. The photoactive component is typically present in the composition in an amount of from 0.1 to 25 wt %, for example from 0.1 to 12 wt %.

One or more components for improving the flexibility of the structures formed from the composition may be present in the composition. These flexibility-improving materials typically contain a plurality of functional groups chosen from hydroxy, amino, thiol, sulphonate ester, carboxylate ester, silyl ester, anhydride, aziridine, methylolmethyl, silyl ether, epoxides, oxetanes, vinyl ethers, silanols and combinations thereof. In the flexibility-improving materials, the functional groups are typically attached to backbone materials. Exemplary backbone materials include substituted and unsubstituted alkyl and aryl hydrocarbons, ethers, acrylates, novolacs, polyimides, polyurethanes, polyesters, polysulfones, polyketones, fullerenes, POSS silicons, nanoparticles, and combinations thereof. The functional groups may be present as end groups on the backbone and/or at one or more locations along the backbone.

Examples of flexibilizing components are polyols of formula $R^3(OH)_x$ wherein $R^3$ is an organic group chosen from substituted or unsubstituted $(C_2-C_{25})$alkyl, $(C_7-C_{25})$ aryl, $(C_8-C_{25})$aralkyl, $(C_6-C_{25})$cycloalkyl, and combinations thereof, wherein x is 2 or more and does not exceed the number of carbon atoms. When x is 2, examples of the flexibilizing component include glycols, which are 1,2 diols, such as $HOCH_2-CHOH-(CH_2)_y-CH_3$ wherein y may be, for example, from 0 to 22, such as propylene glycol and butylene glycol. Other examples include α,ω-diols such as $HO-(CH_2)_z-OH$ wherein z is, for example, from 2 to 25 such as ethylene glycol, 1,3-propanediol and 1,4-butanediol. When x is 3 examples include glycerin and trimethylolpropane.

$R^3$ may also be a polyether of formula $-O-(CR^4_2)_w-$ wherein w is, for example, from 1 to 13 and $R^4$ is the same or different and may be, for example, H, or a substituted or unsubstituted organic group of formula $C_1-C_{12}$ alkyl, aryl, aralkyl or cycloalkyl. Examples of flexibilizing components include polyether diols of polyethylene oxide, polypropylene oxide, polybutylene oxide, and polytetrahydrofurane.

The flexibility-improving component may have a weight average molecular weight, for example, of from 62 to 5000, for example from 62 to 2000. This component is present in an effective amount to improve the flexibility of the composition in a dried state before and after activation. The specific amount will depend, for example on the backbone and type of and number of functional groups of the flexibility-improving component. This component may, for example, be present in the composition in an amount of from 0.5 to 35 wt %, for example from 2 to 20 wt %.

In addition to the foregoing flexibilizers, the use of siloxanes such as those described above with reference to the polymer having units of the formula $((R^2)_2SiO)$ may be used.

Other additives may optionally be present in the compositions including, but are not limited to, surface leveling agents, wetting agents, antifoam agents, adhesion promoters, thixotropic agents, fillers, viscosity modifiers, and the like. Such additives are well known in the art of coating compositions. The use of surface leveling agents, for example silicone-base oils such as SILWET L-7604 silicone-base oil available from Dow Chemical Company, in the compositions may be used. It will be appreciated that more than one additive may be combined in the compositions of the present invention. For example, a wetting agent may be combined with a thixotropic agent. The amounts of such optional additives to be used in the present compositions will depend on the particular additive and desired effect, and are within the ability of those skilled in the art. Such other additives are typically present in the composition in an amount of less than 5 wt %, for example less than 2.5 wt %.

The compositions useful in the methods of the invention may optionally contain one or more organic cross-linking agents. Cross-linking agents include, for example, materials which link up components of the composition in a threedimensional manner. Aromatic or aliphatic cross-linking agents that react with the silicon-containing polymer are suitable for use in the present invention. Such organic cross-linking agents will cure to form a polymerized network with the silicon-containing polymer, and reduce solubility in a developer solution. Such organic cross-linking agents may be monomers or polymers. It will be appreciated by those skilled in the art that combinations of cross-linking agents may be used successfully in the present invention.

Suitable organic cross-linking agents useful in the present invention include, but are not limited to, amine containing compounds, epoxy containing materials, compounds containing at least two vinyl ether groups, allyl substituted aromatic compounds, and combinations thereof. Typical cross-linking agents include amine containing compounds and epoxy containing materials.

The amine containing compounds useful as cross-linking agents in the present invention include, but are not limited to, melamine monomers, melamine polymers, alkylolmethyl melamines, benzoguanamine resins, benzoguanamine-formaldehyde resins, urea-formaldehyde resins, glycoluril-formaldehyde resins, and combinations thereof.

It will be appreciated by those skilled in the art that suitable organic cross-linker concentrations will vary with factors such as cross-linker reactivity and specific application of the composition. When used, the cross-linking agent(s) is typically present in the composition in an amount of from 0.1 to 50 wt %, for example, from 0.5 to 25 wt % or from 1 to 20 wt %.

The compositions may optionally contain one or more solvents. Such solvents aid in formulating the compositions and in coating the compositions on a substrate. A wide variety of solvents may be used. Suitable solvents include, but are not limited to, glycol ethers, such as ethylene glycol monomethyl ether, propylene glycol monomethyl ether, and dipropylene glycol monomethyl ether, esters such as methyl cellosolve acetate, ethyl cellosolve acetate, propylene glycol monomethyl ether acetate, dipropylene glycol monomethyl ether acetate, dibasic esters, carbonates such as propylene carbonate, γ-butyrolactone, esters such as ethyl lactate, n-amyl acetate and n-butyl acetate, alcohols such as n-propanol, isopropanol, ketones such as cyclohexanone, methyl isobutyl ketone, diisobutyl ketone and 2-heptanone, lactones such as γ-butyrolactone and γ-caprolactone, ethers such as diphenyl ether and anisole, hydrocarbons such as mesitylene, toluene and xylene, and heterocyclic compounds such as N-methyl-2-pyrrolidone, N,N'-dimethylpropyleneurea, or mixtures thereof.

The compositions may be prepared by combining, in admixture, the silicon-containing polymer and other optional components in any order.

The polymeric layer may be formed by various techniques including, but not limited to, screen printing, curtain coating, roller coating, slot coating, spin coating, flood coating, electrostatic spray, spray coating, or dip coating. When the composition is spray coated, a heated spray gun may optionally be used. The viscosity of the composition may be adjusted to meet the requirements for each method of application by viscosity modifiers, thixotropic agents, fillers and the like. The thickness of the layer(s) will depend on the particular application. However, typical thicknesses in the dried state are from 1 to 100 μm, for example, from about 10 to 50 μm.

The coated substrate is typically then dried to substantially remove the solvent from the coating. The drying may be conducted, for example, in an oven such as an infrared oven, a convection oven, a convection/conduction oven, a vacuum oven, or on a hot plate. Such drying may take place at various temperatures and times, depending upon the particular solvent chosen and the drying technique. Suitable temperatures are any that are sufficient to substantially remove any solvent present. Typically, the drying may be at any temperature from room temperature (25° C.) to 170° C. and at a time of from 5 seconds to 120 minutes. When using an oven, typical times are from 10 to 120 minutes and from 10 seconds to 10 minutes for a hot plate.

A first clad layer 4 is formed on the substrate 2 (with or without a release layer 3) and a core layer 6 is formed on the first clad layer 4. In the case of a photoimageable core material, core layer 6 is imaged, for example, by exposure to actinic radiation 8 through a photomask 10, as illustrated in FIG. 1B. As shown in FIG. 1C, the unexposed portions of core layer 6 are developed away, leaving one or more core structures 6'. The core layer 6 may be patterned through other techniques, for example, using standard photolithography and etching techniques. In such case, a photoresist may be coated over the waveguide core layer and exposed through artwork containing desired patterns. The exposed areas (in the case of positive photoresist) or the unexposed areas (in the case of negative photoresists) is washed away in a developer. The pattern is transferred to the waveguide core by etching such as reactive ion etching, and the photoresist is removed. Following formation of core structures 6', a second clad layer 12 is formed over the first clad layer 4 and core structures 6', as shown in FIG. 1D. A waveguide structure 14 including first clad layer 4, core layer 6 and second clad layer 12 is thereby formed.

The materials for the first clad, core and second clad layers may be independently selected, with the understanding that the refractive index of the final core structures should be greater than that of the cladding. The thickness of these layers may vary widely, with a thickness of from 5 to 500 μm, for example, from 8 to 50 μm being typical. For single mode applications, a thickness of from 6 to 10 μm is typical while for multimode applications, a thickness of from 40 to 60 μm is typical.

As shown in FIG. 1E, the waveguide structure 14 is next separated from the substrate 2. This may be accomplished, for example, in the case of a glass substrate and silsesquioxane-based waveguide by immersing the structure shown in FIG. 1D in a bath of heated deionized water at a temperature and time effective to cause separation of the waveguide structure 14 from the substrate 2. While the temperature and time will depend on the particular waveguide and substrate materials used, a water temperature of from 30 to 100° C. and time of from 60 to 120 minutes is typical. After separation, the waveguide structure is removed from the bath and is dried to remove any liquid present, for example, by heating in an oven at 110° C. for 15 minutes.

Removal of the substrate may also be accomplished by etching, for example, in the case of copper foil substrates. Suitable etchants include, for example 1% hydrochloric acid, 1% sulfuric acid, cupric chloride and sulfuric peroxide.

In the case a release layer is used between the substrate 2 and waveguide structure 14, the separation technique will depend on the waveguide clad and release layer materials. Separation for certain release layers, for example, polyethylene teraphthalate, thermally or photochemically cured silicone release layers, poly (tetrafluorothylene), polypropylene, polymethyl methacrylate, polysiloxanes and polyamides, separation may be accomplished simply by peeling the waveguide away from the release layer and substrate without using a liquid medium. A stand alone release layer as the substrate may be used if is mechanically sufficient to support processing of the waveguide structure. In general, any substrate may be used that can withstand the process conditions and allows for easy removal of the waveguide materials when completed.

The waveguide formation and separation process described above with reference to FIG. 1 or the process up to separation may advantageously be performed in a clean environment, for example, in a Class 1000 or cleaner environment, which is isolated from the particulated atmosphere in which the printed circuit board substrate is fabricated. As a result, contamination-related effects on waveguide performance such as optical loss characteristics and pattern defects may be minimized or eliminated. The completed waveguide structure may then be brought into the printed circuit board fabrication area for assembly of the printed circuit board.

As shown in FIG. 2A, a printed circuit board substrate 18 is provided. The printed circuit board substrate is typically a laminated sheet including a series of epoxy resin and copper layers, on which etched electronic circuits, conductive traces and electronic components are formed or will be formed on one or both sides. Depending on the board's design, the waveguide structure may be incorporated into the board at an earlier or later stage in the board fabrication process.

The waveguide structure 14 described above is brought into contact with and affixed to the printed circuit board substrate 18, as shown in FIG. 2C. Before doing so, an adhesive material 20, for example, epoxy, acrylic, silicone, rubber, ABS, styrene/butadiene, polyisobutylene, polyisoprene or the like, may be applied to either or both of the contacting surfaces of the waveguide structure 14 and printed circuit board substrate 18, as shown in FIG. 2B. Depending on the adhesive used, further processing, for example, heat curing, photocuring, or drying to remove solvent may be employed. The two structures may be affixed using other techniques, for example: lamination with heat and pressure; or using a partially cured, tacky second clad layer and attaching the waveguide structure to the substrate using the second clad layer as an adhesive layer.

Following attachment of the waveguide structure 14 to the printed circuit board substrate 18, the printed circuit board may be further processed. For example, one or more dielectric and/or metal layers may be formed over the waveguide structure 14, to form a metallization structure for signal routing. Electrically connecting an optoelectronic device such as a photodetector or a laser emitting device, for example, a VCSEL chip, may also be performed at this stage. The printed circuit board is processed to completion using known techniques such as those described in the *Printed Circuit Handbook*, $5^{th}$ ed., McGraw-Hill (2001).

Additional exemplary embodiments of the invention will now be described with reference to the remaining figures. Except where noted, the foregoing description applies also to the further exemplary aspects.

Figure 3:
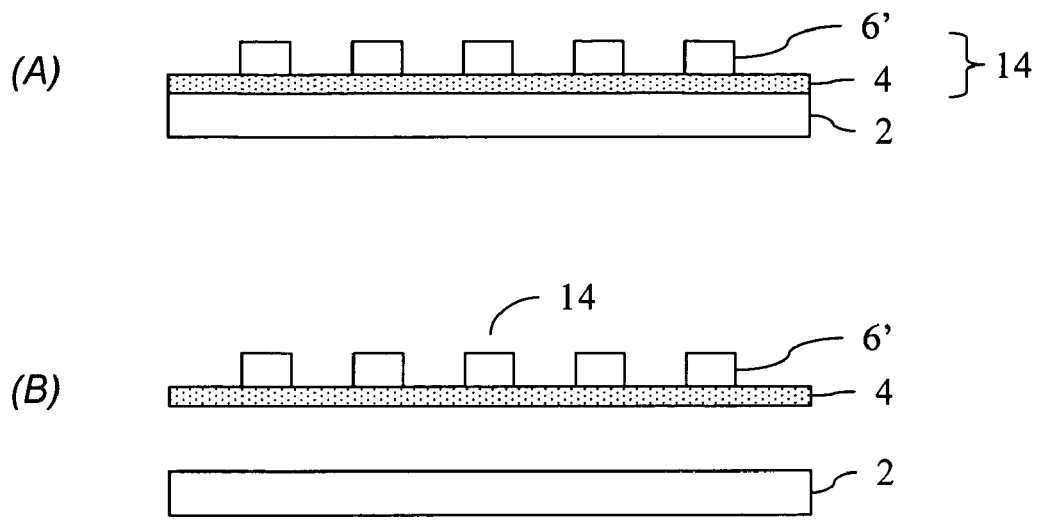
FIG. 3A-B illustrates optical waveguides at various stages of formation thereof, in accordance with a further aspect of the invention.

FIG. 3 illustrates a further exemplary method in accordance with the invention. This process differs from that described above with reference to FIG. 1 in that the waveguide structure 14 is only partially formed. The waveguide structure includes a first clad layer 4 and waveguide core structures 6' formed as described above. The waveguide structure 14 is separated from the substrate 2 after formation of the first clad layer 4 and core 6'. With reference to FIG. 4A, a second clad layer 12 is formed on the surface of the printed circuit board substrate 18. In this embodiment, the second clad layer 12 should have a viscosity such that the core structures 6' of the waveguide structure 14 may be inserted therein with applied pressure. This may be accomplished by partial drying of the second clad material. With the cores facing the circuit board substrate 18 and the second clad layer 12, the core structures 6' are brought into contact with and pushed, for example, by lamination, into the second clad layer 12, as shown in FIG. 4B. Curing of the second clad may be completed by heating.

Figure 5:
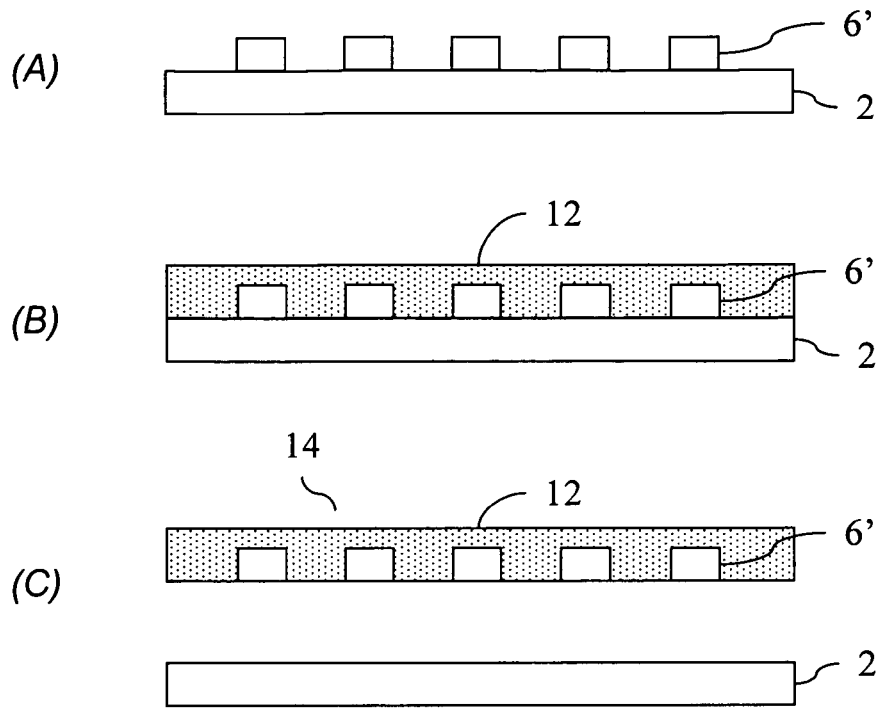
FIG. 5A-C illustrates optical waveguides at various stages of formation thereof, in accordance with a further aspect of the invention.
Figure 6:
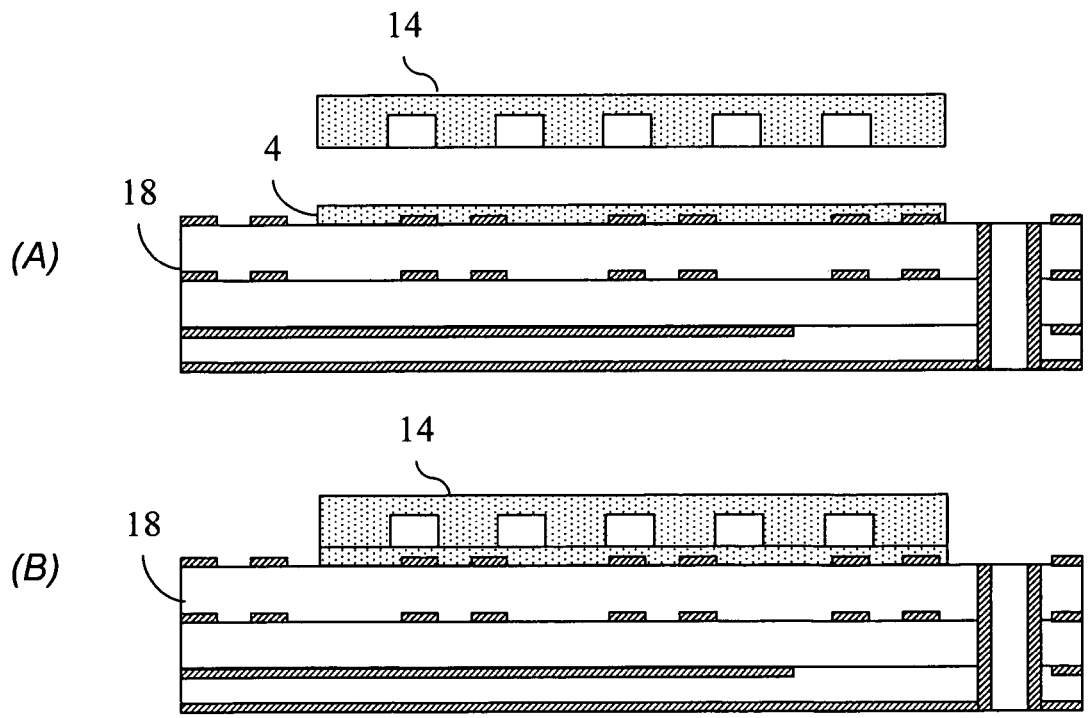
FIG. 6A-B illustrates a printed circuit board incorporating the optical waveguides of FIG. 5 at various stages of formation thereof, in accordance with the invention.

FIGS. 5 and 6 illustrate a further exemplary aspect of the invention, in which core structures 6' are first formed on the substrate 2, and a clad layer 12 is formed over the substrate 2 and core structures 6', as shown in FIGS. 5A-B. The waveguide structure 14 is separated from the substrate as illustrated in FIG. 5C. With reference to FIG. 6A, a clad layer 4 is formed on the printed circuit board substrate. With the exposed portions of the cores facing the circuit board substrate 18 and the clad layer 4, the waveguide structure 14 is brought into contact with the clad layer 4 on the printed circuit board, as shown in FIG. 6B. Affixing the waveguide structure 14 to clad layer 4 may be performed by such techniques as lamination with heat and pressure.

Figure 7:
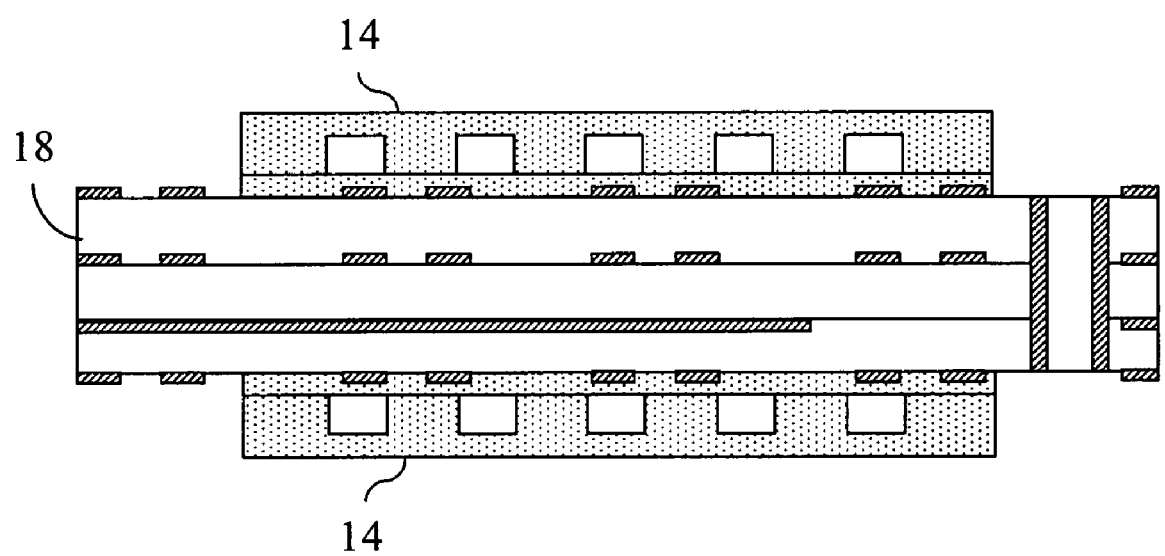
FIG. 7 illustrates a printed circuit board incorporating optical waveguides, in accordance with a further aspect of the invention.

While the foregoing exemplary embodiments illustrate an optical waveguide structure being attached to one surface of the printed circuit board substrate, it should be clear that a plurality waveguide structures may be attached thereto on the same side and/or on opposite sides of the substrate. FIG. 7 illustrates a printed circuit board 18 incorporating optical waveguides 14 on opposite sides of the substrate. Such a structure allows for increased density of optical interconnections.

The following prophetic examples are intended to illustrate further various aspects of the present invention, but are not intended to limit the scope of the invention in any aspect.

EXAMPLES

Example 1

A. Waveguide Formation

Clad (1) Formation

A first clad layer composition is formed by combining in admixture 39.8 wt % propylene glycol monomethyl ether acetate, 49.99 wt % phenyl-methyl silsesquioxane (50:50), 10 wt % polytetrahydrofurane, 0.2 wt % of an amine blocked p-toluene sulfonic acid and 0.01 wt % Dow SILWET L-7604 silicone-base oil. The composition is roller-coated onto a glass substrate and soft-baked in a forced air oven for 15 minutes at 90° C. to a thickness of 15 μm, and is then hard-baked in a forced air oven for 60 minutes at 180° C.

Core Formation

A core layer composition is formed by combining in admixture 45 wt % propylene glycol monomethyl ether acetate, 49 wt % phenyl-methyl silsesquioxane (50:50), 5 wt % polydiphenylsiloxane, 0.99 wt % triphenylsulfonium hexafluorophosphate, and 0.01 wt % Dow SILWET L-7604 silicone-base oil. The composition is roller-coated on the first clad layer and soft-baked in a forced air oven for 10 minutes at 90° C., to a thickness of 50 μm. Artwork defining a core structure is placed directly on the core layer. The artwork includes patterns for forming waveguides of various dimensions and shapes, such as linear, branched, and curved shaped waveguides between 2 and 14 cm in length and 25 to 75 μm in width. 800 mJ/cm$^2$ of actinic radiation is applied to the construction followed by a post-exposure-bake in a forced air oven at 90° C. for 15 minutes. The exposed substrate is dipped in a 0.7N sodium hydroxide developer solution held at 38° C. for 2 minutes. The substrate is rinsed in de-ionized water and dried. The layers are baked in a forced air oven for 60 minutes at 180° C.

Clad (2) Formation

A second clad layer is formed over the core structure and first clad layer using the same composition and procedures used in forming the first clad layer, except the thickness of the second clad layer after the soft-bake is 70 µm. Optical waveguides are thereby formed.

Waveguide Separation

The substrate is immerse in a deionized water bath at 99° C. for 30 minutes, causing the waveguide structure to separate from the substrate. The waveguide structure is removed from the bath and is dried in an oven at 95° C. for 30 minutes.

B. Printed Circuit Board Formation

A multilayer copper based circuit board having two inner layers of copper circuitry and two outer layers of printed circuitry prepared by standard lamination methods including layering with epoxy pre-preg and laminating is provided. The circuit board has an area on its surface to which the waveguide structure is to be bonded. A silicone adhesive is coated on the bonding region of the circuit board. The waveguide structure is pressed onto the adhesive, and the adhesive is cured at 50° C. for 30 minutes. Through holes are drilled through the waveguide and circuit board. Copper is plated over the circuit board. A tentable photoresist is applied to the substrate surface, and is exposed through a photomask and developed to form a mask for defining metal traces and plated through holes. The copper is etched to form the copper traces and plated through holes, and the photoresist mask is removed.

Example 2

A. Waveguide Formation

Clad (1) Formation

A first clad layer is formed by curtain coating a stainless steel substrate with an admixture of 39.8 wt % propylene glycol monomethyl ether acetate, 49.99 wt % phenyl-methyl silsesquioxane (33:67), 10 wt % butanediol diglycidyl ether, 0.2 wt % of an amine blocked p-toluene sulfonic acid and 0.01 wt % Dow SILWET L-7604 silicone-base oil. The composition is soft-baked in a forced air oven for 15 minutes at 90° C., to a thickness of 10 µm. The composition is hard-baked in a forced air oven for 60 minutes at 180° C.

Core Formation

A core layer composition is formed by combining in admixture 45 wt % propylene glycol monomethyl ether acetate, 49 wt % phenyl-methyl-dimethyl silsesquioxane (48:48:4), 5 wt % polydiphenylsiloxane, 0.99 wt % triphenylsulfonium triflate, and 0.01 wt % Dow SILWET L-7604 silicone-base oil. The composition is curtain coated on the first clad layer and soft-baked in a forced air oven for 10 minutes at 90° C., to a thickness of 50 µm. Artwork and subsequent processing as described in Example 1 are used to form core structures, except the applied actinic radiation is 500 mJ/cm$^2$.

Clad (2) Formation

A second clad layer is formed over the core structure and first clad layer using the same composition and procedures used in forming the first clad layer, except the thickness of the second cladding layer after the soft-bake is 70 µm. Optical waveguides are thereby formed.

Waveguide Separation

The substrate is immersed in a deionized water bath at 50° C. for 10 minutes, causing the waveguide structure to separate from the substrate. The waveguide structure is removed from the bath and is dried in an oven at 95° for 30 minutes.

B. Printed Circuit Board Formation

A multilayer copper based circuit board is prepared as described in Example 1, except an acrylic adhesive is used in place of the silicone adhesive, and the adhesive is cured by exposure to actinic radiation of 1000 mJ/cm$^2$.

Example 3

A. Waveguide Formation

Release Layer Formation

A 3 µm thick epoxy-polysiloxane layer is formed on a copper clad panel by roller coating, and is cured at 100° C. for 15 minutes to form a release layer.

Clad (1) Formation

A first clad layer is formed on the release layer by roller coating a composition which is an admixture of 44.8 wt % propylene glycol monomethyl ether acetate, 49.99 wt % phenyl-methyl silsesquioxane (33:67), 5 wt % polycaprolactone, 0.2 wt % of an amine blocked p-toluene sulfonic acid and 0.01 wt % Dow SILWET L-7604 silicone-base oil. The composition is soft-baked in a forced air oven for 15 minutes at 90° C., to a thickness of 10 µm. The composition is hard-baked in a forced air oven for 60 minutes at 180° C.

Core Formation

Core structures are formed on the first clad layer as described in Example 1, except using a composition formed by combining in admixture 45 wt % propylene glycol monomethyl ether acetate, 49 wt % phenyl-methyl-dimethyl silsesquioxane (49:49:2), 5 wt % polydiphenylsiloxane, 0.99 wt % triphenylsulfonium triflate, and 0.01 wt % Dow SILWET L-7604 silicone-base oil, and exposing the core layer with 500 mJ/cm$^2$ of actinic radiation.

Clad (2) Formation

A second clad layer is formed over the core structures and first clad layer using the same composition and procedures used in forming the first clad layer, except the thickness of the second clad layer after the soft-bake is 70 µm. Optical waveguides are thereby formed.

Waveguide Separation

The waveguide is removed from the release layer and substrate by peeling.

B. Printed Circuit Board Formation

A multilayer copper based circuit board is prepared as described in Example 1, except a UV curable silicone adhesive is used in place of the silicone adhesive, and the adhesive is cured by exposure to 1000 mJ/cm$^2$ actinic radiation. Structures as shown in FIGS. 1-2 are thereby formed.

Example 4

A. Waveguide Formation

Clad Formation

A first clad layer is formed by curtain coating a stainless steel substrate with an admixture of 39.8 wt % propylene glycol monomethyl ether acetate, 49.99 wt % phenyl-methyl silsesquioxane (33:67), 10 wt % butanediol diglycidyl ether, 0.2 wt % of an amine blocked p-toluene sulfonic acid and 0.01 wt % Dow SILWET L-7604 silicone-base oil. The composition is soft-baked in a forced air oven for 15 minutes at 90° C., to a thickness of 10 µm. The composition is hard-baked in a forced air oven for 60 minutes at 180° C.

Core Formation and Waveguide Separation

Core structures are formed on the first clad layer and the waveguide structure separated from the substrate and processed as described in Example 2.

B. Printed Circuit Board Formation

Figure 4:
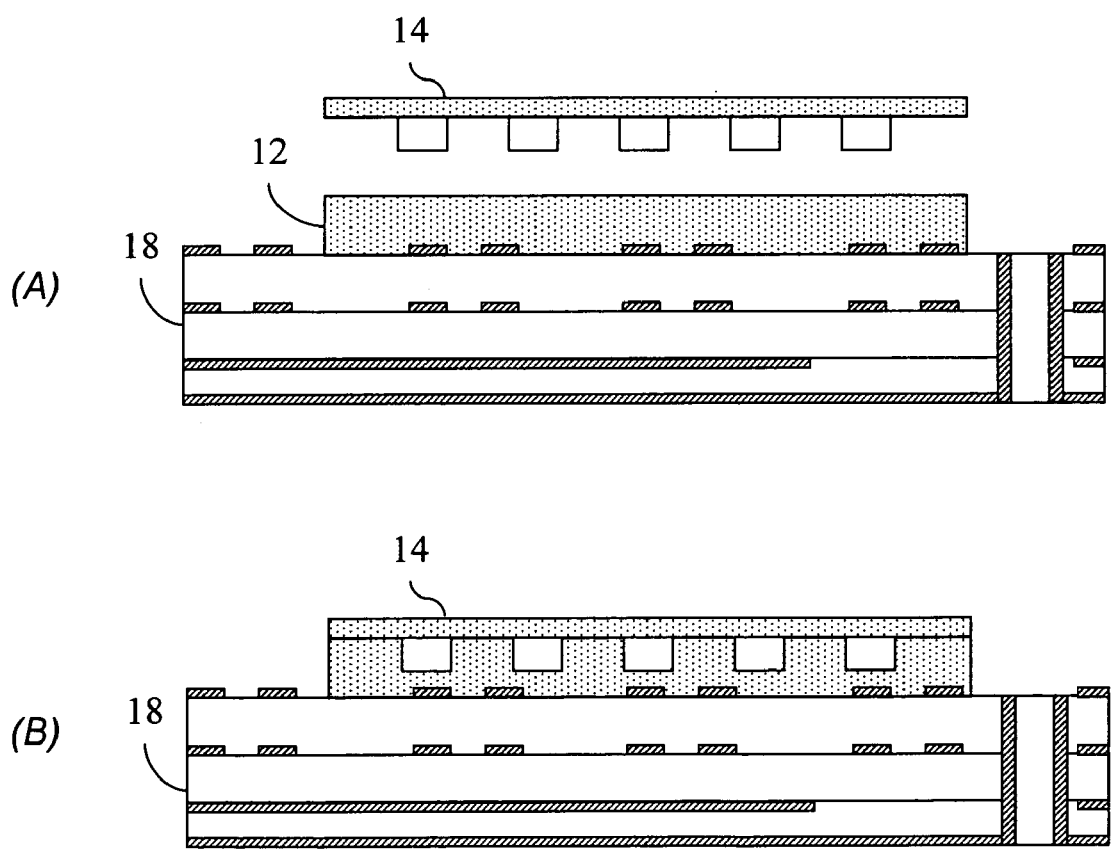
FIG. 4A-B illustrates a printed circuit board incorporating the optical waveguides of FIG. 3 at various stages of formation thereof, in accordance with the invention.

A multilayer copper based circuit board having two inner layers of copper circuitry and two outer layers of printed circuitry prepared by standard lamination methods including layering with epoxy pre-preg and laminating is provided. The circuit board has an area on its surface to which the waveguide structure is to be bonded. The bonding area of the circuit board is roller coated with the same clad material used in forming the first clad layer to create a second clad layer. The second clad layer is soft baked in a forced air oven at 90° C. for 10 minutes to a thickness of 80 µm. The core structures of the separated waveguide structure are placed in contact with the second clad layer on the circuit board, and the core structures are pressed into the clad under a pressure of 20 psi. The entire structure is cured in a forced air oven at 180° C. for 60 minutes. Through holes are drilled though the waveguide and circuit board. Copper is plated over the circuit board. A tentable photoresist is applied to the substrate surface, and is exposed through a photomask and developed to form a mask for defining metal traces and plated through holes. The copper is etched to form the copper traces and plated through holes, and the photoresist mask is removed. Structures as shown in FIGS. 3-4 are thus formed.

Example 5

A. Waveguide Formation

Core Formation

Core structures are formed on a stainless steel substrate otherwise using the materials and procedures described in Example 2.

Clad Formation and Waveguide Separation

A clad layer is formed over the core structures and the resulting waveguide structure separated from the substrate using the materials and procedures described in Example 2 (Clad (2) formation and waveguide separation).

B. Printed Circuit Board Formation

A multilayer copper based circuit board having two inner layers of copper circuitry and two outer layers of printed circuitry prepared by standard lamination methods including layering with epoxy pre-preg and laminating is provided. The circuit board has an area on its surface to which the waveguide structure is to be bonded. The bonding area of the circuit board is roller coated with the same clad material used in forming the first clad layer to create a second clad layer. The second clad layer is soft baked in a forced air oven at 90° C. for 10 minutes to a thickness of 15 µm. With the exposed portions of the core structures facing the circuit board, the waveguide structure is placed in contact with the clad layer on the circuit board and is pressed against the clad under a pressure of 20 psi at 100° C. The entire structure is cured in a forced air oven at 180° C. for 60 minutes. Through holes are drilled though the waveguide and circuit board. Copper is plated over the circuit board. A tentable photoresist is applied to the substrate surface, and is exposed through a photomask and developed to form a mask for defining metal traces and plated through holes. The copper is etched to form the copper traces and plated through holes, and the photoresist mask is removed. Structures as shown in FIGS. 5-6 are thus formed.

Examples 6-10

The waveguides prepared in Examples 1 through 5, respectively, are applied to both sides of a multilayer circuit board using the same procedures described in each Example. A structure as shown in FIG. 7 is thus formed.

While the invention has been described in detail with reference to specific embodiments thereof, it will be apparent to one skilled in the art that various changes and modifications can be made, and equivalents employed, without departing from the scope of the claims.

What is claimed is:

1. A method of forming a printed circuit board having optical functionality, comprising:
    (a) providing a first, printed circuit board substrate;
    (b) forming an optical waveguide structure comprising a clad and a core structure on a second substrate, separate from the printed circuit board substrate, wherein the optical waveguide structure comprises a polymer comprising units of the formula ($R^1SiO_{1.5}$), wherein $R^1$ is a substituted or unsubstituted organic group, comprising:
        forming a first clad layer on the second substrate;
        forming on the first clad layer a core layer from a composition comprising:
            units of the formula ($R^1SiO_{1.5}$) and a plurality of functional end groups;
            and a first component for altering the solubility of the composition upon exposure to actinic radiation;
        exposing a portion of the core layer to actinic radiation;
        developing the core layer, thereby forming the core structure; and
        forming a second clad layer on the first clad layer and core structure;
    (c) separating the optical waveguide structure from the second substrate; and
    (d) affixing the optical waveguide structure to the printed circuit board substrate.

2. The method of claim 1, wherein the silicon-containing polymer further comprises units of the formula ($R^2SiO_{1.5}$), wherein $R^1$ is a substituted or unsubstituted alkyl group and $R^2$ is a substituted or unsubstituted aryl group.

3. The method of claim 1, wherein the second substrate is formed of glass.

4. The method of claim 1, wherein (b) further comprises providing a release layer between the second substrate and the optical waveguide structure.

5. A method of forming a printed circuit board having optical functionality, comprising:
    (a) providing a first, printed circuit board substrate;
    (b) forming an optical waveguide structure comprising a clad and a core structure on a second substrate, separate from the printed circuit board substrate, wherein the optical waveguide structure comprises a polymer comprising units of the formula ($R^1SiO_{1.5}$), wherein $R^1$ is a substituted or unsubstituted organic group, and wherein formation of the core structure comprises:
        (b1) forming a core layer from a composition comprising units of the formula ($R^1SiO_{1.5}$) and a plurality of functional end groups; and a first component for altering the solubility of the composition upon exposure to actinic radiation;
        (b2) exposing a portion of the core layer to actinic radiation; and
        (b3) developing the core layer, thereby forming the core structure; and
        (b4) forming a first clad layer on the second substrate and the core structure;
    (c) separating the optical waveguide structure from the second substrate;
    (d) forming a second clad layer on the printed circuit board substrate; and
    (e) affixing the first clad layer and core structures to the second clad layer.

6. The method of claim 5, wherein (b) further comprises providing a release layer between the second substrate and the optical waveguide structure.

7. The method of claim 5, wherein the silicon-containing polymer further comprises units of the formula ($R^2SiO_{1.5}$), wherein $R^1$ is a substituted or unsubstituted alkyl group and $R^2$ is a substituted or unsubstituted aryl group.

8. A method of forming a printed circuit board having optical functionality, comprising:
   (a) providing a first, printed circuit board substrate;
   (b) forming an optical waveguide structure comprising a clad and a core structure on a second substrate, separate from the printed circuit board substrate, wherein a release layer is provided between the second substrate and the optical waveguide structure, wherein the optical waveguide structure comprises a polymer comprising units of the formula ($R^1SiO_{1.5}$), wherein $R^1$ is a substituted or unsubstituted organic group, and wherein formation of the core structure comprises:
      (b1) forming a core layer from a composition comprising units of the formula ($R^1SiO_{1.5}$) and a plurality of functional end groups; and a first component for altering the solubility of the composition upon exposure to actinic radiation;
      (b2) exposing a portion of the core layer to actinic radiation; and
      (b3) developing the core layer, thereby forming the core structure;
   (c) separating the optical waveguide structure from the second substrate; and
   (d) affixing the optical waveguide structure to the printed circuit board substrate.

9. The method of claim 8, wherein (b) comprises:
   forming a first clad layer on the second substrate;
   forming the core layer and core structure on the first clad layer; and
   forming a second clad layer on the printed circuit board substrate prior to (d), and wherein (d) comprises affixing the first clad layer and the core structure to the second clad layer.

10. The method of claim 8, wherein the silicon-containing polymer further comprises units of the formula ($R^2SiO_{1.5}$), wherein $R^1$ is a substituted or unsubstituted alkyl group and $R^2$ is a substituted or unsubstituted aryl group.

11. A method of forming a printed circuit board having optical functionality, comprising:
   (a) providing a first, printed circuit board substrate;
   (b) forming an optical waveguide structure comprising a clad and a core structure on a second substrate, separate from the printed circuit board substrate, wherein the optical waveguide structure comprises a polymer comprising units of the formula ($R^1SiO_{1.5}$), wherein $R^1$ is a substituted or unsubstituted organic group, and wherein formation of the core structure comprises:
      (b1) forming a core layer from a composition comprising units of the formula ($R^1SiO_{1.5}$) and a plurality of functional end groups; and a first component for altering the solubility of the composition upon exposure to actinic radiation;
      (b2) exposing a portion of the core layer to actinic radiation; and
      (b3) developing the core layer, thereby forming the core structure;
   (c) contacting the second substrate and optical waveguide structure with heated water to separate the optical waveguide structure from the second substrate; and
   (d) affixing the optical waveguide structure to the printed circuit board substrate.

12. The method of claim 11, wherein (b) further comprises providing a release layer between the second substrate and the optical waveguide structure.

13. The method of claim 11, wherein the silicon-containing polymer further comprises units of the formula ($R^2SiO_{1.5}$), wherein $R^1$ is a substituted or unsubstituted alkyl group and $R^2$ is a substituted or unsubstituted aryl group.

* * * * *